(12) United States Patent
Zhang et al.

(10) Patent No.: US 11,373,841 B1
(45) Date of Patent: Jun. 28, 2022

(54) SECONDARY ELECTRON PROBE AND SECONDARY ELECTRON DETECTOR (71) Applicants: Tsinghua University, Beijing (CN); HON HAI PRECISION INDUSTRY CO., LTD., New Taipei (TW)

(72) Inventors: Ke Zhang, Beijing (CN); Guo Chen, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/225,707

(22) Filed: Apr. 8, 2021

(30) Foreign Application Priority Data

Dec. 17, 2020 (CN) .......................... 202011497831.6

(51) Int. Cl.
*H01J 37/28* (2006.01)
*H01J 37/244* (2006.01)
(52) U.S. Cl.
CPC ............ *H01J 37/28* (2013.01); *H01J 37/244* (2013.01); *H01J 2237/2448* (2013.01)
(58) Field of Classification Search
CPC ... H01J 37/28; H01J 37/244; H01J 2237/2448
See application file for complete search history.

(56) References Cited

U.S. PATENT DOCUMENTS

| | | | | |
|---|---|---|---|---|
| 6,346,775 B1* | 2/2002 | Lee | ......................... | H01J 11/12 977/939 |
| 6,712,864 B2* | 3/2004 | Horiuchi | ............... | C01B 32/168 156/73.2 |
| 8,048,256 B2* | 11/2011 | Feng | ..................... | C01B 32/168 428/317.1 |
| 8,431,053 B2* | 4/2013 | Liu | ....................... | B82Y 30/00 264/146 |
| 8,717,559 B2* | 5/2014 | Sun | ........................ | G01N 21/65 356/300 |
| 9,394,176 B2* | 7/2016 | Wei | ....................... | B29C 65/002 |
| 9,481,125 B2* | 11/2016 | Wei | ....................... | B29C 59/022 |
| 9,650,253 B2* | 5/2017 | Wei | ........................ | C01B 32/16 |
| 9,695,045 B2* | 7/2017 | Wei | ........................ | C01B 32/16 |
| 9,826,317 B2* | 11/2017 | Wei | ...................... | H04R 23/002 |
| 9,862,170 B2* | 1/2018 | Wei | ......................... | C23C 16/26 |
| 2002/0182109 A1* | 12/2002 | Hidaka | ................. | B82Y 15/00 422/68.1 |

(Continued)

FOREIGN PATENT DOCUMENTS

CN 112011232 12/2020
JP 2005-32542 2/2005

(Continued)

*Primary Examiner* — David A Vanore
(74) *Attorney, Agent, or Firm* — ScienBiziP, P.C.

(57) ABSTRACT

A secondary electron probe is provided. The secondary electron probe comprises a porous carbon material layer. The porous carbon material layer consists of a plurality of carbon material particles and a plurality of micro gaps, the plurality of micro gaps are located between the plurality of carbon material particles. The porous carbon material layer is an electronic blackbody. A secondary electron detector and a scanning electron microscope probe using the secondary electron probe are also provided.

15 Claims, 8 Drawing Sheets

(56) References Cited

U.S. PATENT DOCUMENTS

| | | | |
|---|---|---|---|
| 2003/0062488 A1* | 4/2003 | Fink | H01J 33/00 250/492.3 |
| 2003/0091825 A1* | 5/2003 | Shiffler, Jr. | H01J 9/14 427/249.1 |
| 2003/0127594 A1 | 7/2003 | Schneiker | |
| 2003/0173884 A1* | 9/2003 | Heo | H01J 43/246 313/103 R |
| 2004/0105807 A1* | 6/2004 | Fan | D01F 9/1272 423/447.3 |
| 2006/0255287 A1* | 11/2006 | Cholewa | G01T 1/28 250/397 |
| 2012/0282453 A1* | 11/2012 | Wang | B82Y 30/00 427/427 |
| 2012/0321961 A1* | 12/2012 | Yushin | B82Y 10/00 977/948 |
| 2013/0156678 A1* | 6/2013 | Banerjee | H01G 11/36 204/507 |
| 2014/0329082 A1* | 11/2014 | Divigalpitiya | H01L 51/442 428/408 |
| 2015/0368105 A1 | 12/2015 | Wei et al. | |
| 2018/0204704 A1* | 7/2018 | Suzuki | H01J 37/222 |
| 2019/0157037 A1* | 5/2019 | Tomimatsu | G02B 27/0955 |

FOREIGN PATENT DOCUMENTS

| | | |
|---|---|---|
| JP | 2020-9779 | 1/2020 |
| TW | 201609528 | 3/2016 |

\* cited by examiner

SECONDARY ELECTRON PROBE AND SECONDARY ELECTRON DETECTOR

CROSS-REFERENCE TO RELATED APPLICATIONS

This application claims all benefits accruing under 35 U.S.C. § 119 from China Patent Application No. 202011497831.6, filed on Dec. 17, 2020, in the China Intellectual Property Office, the contents of which are hereby incorporated by reference. The application is also related to copending applications entitled, "DEVICE AND METHOD FOR DETECTING ELECTRON BEAM", filed on Apr. 8, 2021 (application Ser. No. 17/225,696); "ELECTRONIC BLACKBODY CAVITY AND SECONDARY ELECTRON DETECTION DEVICE USING THE SAME", filed on Apr. 8, 2021 (application Ser. No. 17/225,702); "METHOD FOR MAKING ELECTRONIC BLACKBODY STRUCTURE AND ELECTRONIC BLACKBODY STRUCTURE", filed on Apr. 8, 2021 (application Ser. No. 17/225,713); "ELECTRONIC BLACKBODY MATERIAL AND ELECTRON DETECTOR", filed on Apr. 8, 2021 (application Ser. No. 17/225,721); and "DEVICE AND METHOD FOR MEASURING ELECTRON BEAM", filed on Apr. 8, 2021 (application Ser. No. 17/225,726).

FIELD

The present disclosure relates to a secondary electron probe, a secondary electron detector and a scanning electron microscope probe using the secondary electron probe.

BACKGROUND

Secondary electrons refer to electrons emitted from a surface of an object in a depth range of 5-10 nm, when the surface of the object is bombarded with an electron flow or an ion flow. The secondary electrons are sensitive to a surface morphology of a sample. Therefore, the surface morphology of the sample can be displayed effectively by detecting the secondary electrons emitted from the surface of the sample. A principle of the secondary electron is applied to detecting elements such as electron multiplier tubes, photomultiplier tubes, microchannel plates, Faraday cups, and Daly detectors. The principle of the secondary electron is also applied to electronic imaging elements such as scanning electron microscope. With a rapid development of an electronic technology, the secondary electron emission phenomenon has attracted more and more attention.

A material of conventional secondary electron probes are generally metallic materials. When the secondary electrons hit a surface of the metal material, a part of the secondary electrons are absorbed and a large number of the secondary electrons are reflected by the metal material or penetrate the metal material. Therefore, an absorption rate of the metal materials for the secondary electrons is relatively low, generally around 40%. As part of the secondary electrons escaping from the surface of the object cannot be collected by the secondary electron probe, a collection efficiency of the secondary electrons escaping from the surface of the object is reduced, and the accuracy of the conventional secondary electron probes is low; and the clarity and authenticity of the surface morphology detected by the scanning electron microscope are also affected.

At present, there is no material that can absorb nearly 100% of electrons; this material can also be called an electronic black body. In the prior art, to achieve 100% absorption rate of electrons, a complicated structure needs to be designed and the cost is high, but the effect is not ideal. Therefore, there are needs to design a secondary electron probe and secondary electron detector with simple structure and almost 100% absorption rate of electrons.

BRIEF DESCRIPTION OF THE DRAWINGS

Implementations of the present technology will now be described, by way of example only, with reference to the attached figures, wherein.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 1:
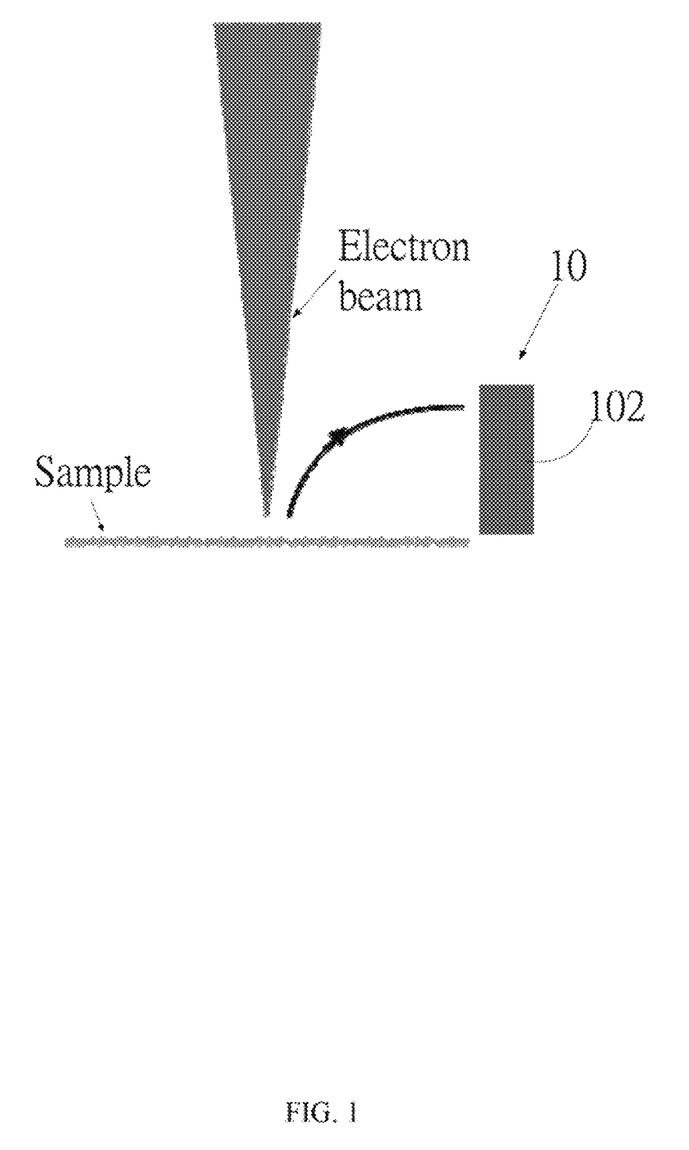
FIG. 1 is a structure schematic diagram of one embodiment of a secondary electron probe.

Referring to FIG. 1, one embodiment is described in relation to a secondary electron probe 10. The secondary electron probe 10 comprises a porous carbon material layer 102. The porous carbon material layer 102 comprises a plurality of carbon material particles, and there are a plurality of micro gaps between the plurality of carbon material particles. A size of each of the plurality of micro gaps is in nanoscale or microscale. The porous carbon material layer 102 is a self-standing structure. The term "self-standing" means that the porous carbon material layer 102 can maintain its own specific shape without being supported by a substrate.

The size of each of the plurality of micro gaps is in nanoscale or microscale. The term "nanoscale" means that the size of each of the plurality of micro gaps is less than or equal to 1000 nanometers, and the term "microscale" means that the size of each of the plurality of micro gaps is less than or equal to 1000 micrometers. In some embodiments, the term "nanoscale" means that the size of each of the plurality of micro gaps is less than or equal to 100 nanometers, and the term "microscale" means that the size of each of the plurality of micro gaps is less than or equal to 100 micrometers.

In one embodiment, the porous carbon material layer 102 is a pure carbon structure, the pure carbon structure means that the porous carbon material layer 102 only consists of a plurality of carbon material particles without other impurities; and the plurality of carbon material particles are also pure carbon material particles, and the pure carbon material particles only consists of carbon atoms. The "pure carbon material particles" means that a range of a purity of the plurality of carbon material particles is more than 99.99%.

There are nanoscale or microscale gaps between the plurality of carbon material particles in the porous carbon material layer 102. When the secondary electrons enter the porous carbon material layer 102, the secondary electrons are refracted and reflected multiple times in the plurality of micro gaps between the plurality of carbon material particles, and the secondary electrons cannot be emitted from the porous carbon material layer 102, and an electron absorption rate of the porous carbon material layer 102 can reach almost 100%. Therefore, the porous carbon material layer 102 can be regarded as an absolute black body of secondary electrons. The porous carbon material layer 102 has an excellent collection effect on secondary electrons, when the secondary electrons escaping from the surface of the sample, the secondary electrons are detected by the secondary electron probe 10 using the porous carbon material layer 102, there is substantially no secondary electron is missed. Therefore, the secondary electron probe 10 using the porous carbon material layer has high secondary electron collection efficiency and detection accuracy.

Figure 2:
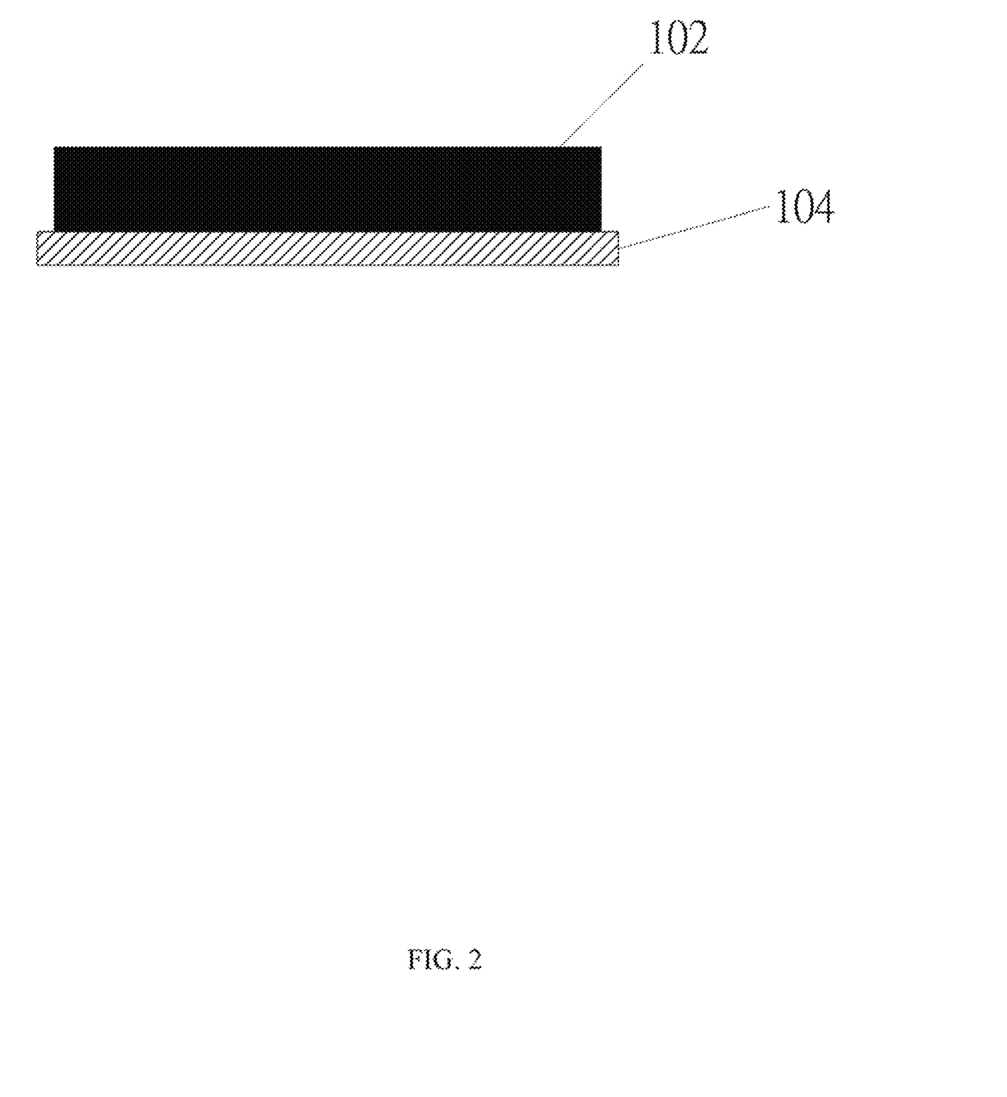
FIG. 2 is a structure schematic diagram of one embodiment of a carbon nanotube structure located on an insulating substrate.

Referring to FIG. 2, in one embodiment, the porous carbon material layer 102 is located on a surface of an insulating substrate 104. The insulating substrate 104 can be a flat structure. The insulating substrate 104 can be a flexible substrate or a rigid substrate. For example, a material of the insulating substrate 104 can be glass, plastic, silicon wafer, silicon dioxide wafer, quartz wafer, polymethyl methacrylate (PMMA), polyethylene terephthalate (PET), silicon, silicon with oxide layer, or quartz. A size of the substrate 104 is selected according to actual needs. In one embodiment, the porous carbon material layer 102 is located on a surface of a silicon substrate.

The plurality of carbon material particles comprise one or two of linear particles and spherical particles. A maximum diameter of a cross section of each of the linear particles is less than or equal to 1000 micrometers. The linear particles can be carbon fibers, carbon micron-wires, carbon nanotubes, and the like. A maximum diameter of each of the spherical particles is less than or equal to 1000 micrometers. The spherical particles can be carbon nanospheres, carbon microspheres, and the like. In one embodiment, the plurality of carbon material particles are a plurality of carbon nanotubes, and the porous carbon material layer 102 is a carbon nanotube structure. In one embodiment, the carbon nanotube structure is a pure carbon nanotube structure, the pure carbon nanotube structure means that the carbon nanotube structure only consists of carbon nanotubes without other impurities, and the carbon nanotubes are also pure carbon nanotubes. The carbon nanotube structure is a carbon nanotube array or a carbon nanotube network structure.

In one embodiment, the carbon nanotube structure is the carbon nanotube array, and the carbon nanotube array is located on an insulating substrate 104. There is a crossing angle between an extending direction of the carbon nanotubes of the carbon nanotube array and the insulating substrate 104. The crossing angle is greater than 0 degrees and less than or equal to 90 degrees. The crossing angle is more conducive to the plurality of micro gaps in the carbon nanotube array to prevent the secondary emitted from the carbon nanotube array, to improve the absorption rate of the carbon nanotube array for secondary electrons; and thereby improving the detection accuracy of secondary electrons.

Figure 3:
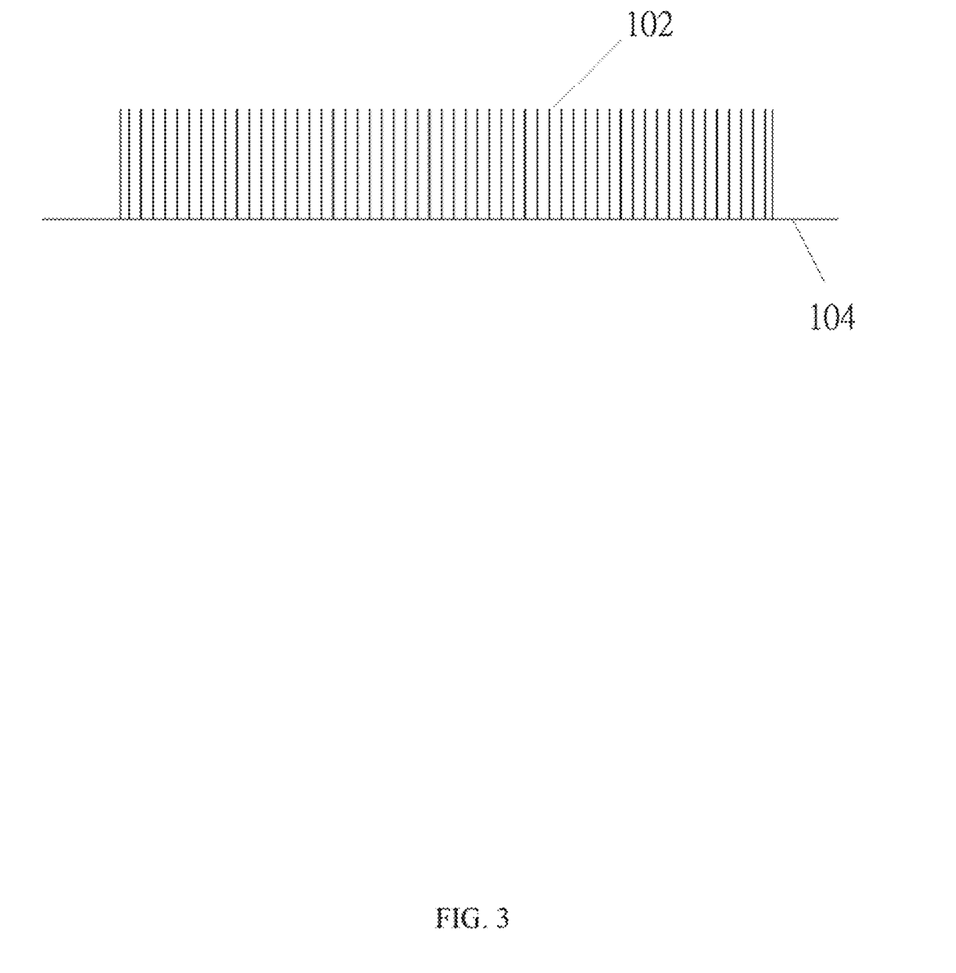
FIG. 3 is a structure schematic diagram of one embodiment of a super-aligned carbon nanotube array located on the insulating substrate.

Referring to FIG. 3, in one embodiment, the carbon nanotube structure is a super-aligned carbon nanotube array, and the super-aligned carbon nanotube array is located on the insulating substrate 104. The super-aligned carbon nanotube array can be grown directly on the insulating substrate 104; the super-aligned carbon nanotube array can also be transferred from its growth substrate to the insulating substrate 104. The super-aligned carbon nanotube array comprises a plurality of carbon nanotubes parallel to each other and perpendicular to the insulating substrate 104. A minority of the plurality of carbon nanotubes in the carbon nanotube array may be randomly aligned. However, the number of randomly aligned carbon nanotubes is very small and does not affect the overall oriented alignment of the majority of the plurality of carbon nanotubes in the carbon nanotube array. The super-aligned carbon nanotube array is free with impurities, such as amorphous carbon or residual catalyst metal particles, etc. The plurality of carbon nanotubes of the super-aligned carbon nanotube array are joined together through van der Waals forces to form an array.

A size, a thickness, and a surface area of the super-aligned carbon nanotube array can be selected according to actual needs. Examples of a method of making the super-aligned carbon nanotube array is taught by U.S. Pat. No. 8,048,256 to Feng et al. The carbon nanotube array is not limited to the super-aligned carbon nanotube array, and can also be other carbon nanotube arrays.

A plurality of meshes can be formed between carbon nanotubes in the carbon nanotube network structure, and a size of each of the plurality of meshes is in nanoscale or microscale. The carbon nanotube network structure can be but not limited to a carbon nanotube sponge, a carbon nanotube film structure, a carbon nanotube paper, or a network structure formed by woven or entangled a plurality of carbon nanotube wires.

The carbon nanotube sponge is a spongy carbon nanotube macroscopic structure formed by intertwining a plurality of carbon nanotubes, and the carbon nanotube sponge is a self-supporting porous structure.

Each of the plurality of carbon nanotube wires comprises a plurality of carbon nanotubes, and the plurality of carbon nanotubes are joined end to end through van der Waals forces to form a macroscopic wire structure. The carbon nanotube wire can be an untwisted carbon nanotube wire or a twisted carbon nanotube wire. The untwisted carbon nanotube wire comprises a plurality of carbon nanotubes substantially oriented along a length of the untwisted carbon nanotube wire. The twisted carbon nanotube wire comprises a plurality of carbon nanotubes spirally arranged along an axial direction of the twisted carbon nanotube wire. The twisted carbon nanotube wire can be formed by relatively rotating two ends of the untwisted carbon nanotube. During rotating the untwisted carbon nanotube wire, the plurality of carbon nanotubes of the untwisted carbon nanotube wire are arranged spirally along an axial direction and joined end to end by van der Waals force in an extension direction of the untwisted carbon nanotube wire, to form the twisted carbon nanotube wire.

The carbon nanotube film structure is formed by a plurality of carbon nanotube films stacked with each other, adjacent carbon nanotube films are combined by van der Waals forces, and a plurality of micro gaps between the carbon nanotubes of the carbon nanotube film structure.

The carbon nanotube film can be a drawn carbon nanotube film, a flocculated carbon nanotube film or a pressed carbon nanotube film.

The drawn carbon nanotube film includes a number of carbon nanotubes that are arranged substantially parallel to a surface of the drawn carbon nanotube film. A large number of the carbon nanotubes in the drawn carbon nanotube film can be oriented along a preferred orientation, meaning that a large number of the carbon nanotubes in the drawn carbon nanotube film are arranged substantially along the same direction. An end of one carbon nanotube is joined to another end of an adjacent carbon nanotube arranged substantially along the same direction, by van der Waals force, to form a free-standing film. The term 'free-standing' includes films that do not have to be supported by a substrate. The drawn carbon nanotube film can be formed by drawing from a carbon nanotube array. A width of the drawn carbon nanotube film relates to the carbon nanotube array from which the drawn carbon nanotube film is drawn. A thickness of the carbon nanotube drawn film can range from about 0.5 nanometers to about 100 micrometers. Examples of a drawn carbon nanotube film is taught by U.S. Pat. No. 7,992,616 to Liu et al., and US patent application US 2008/0170982 to Zhang et al. In one embodiment, the carbon nanotube film structure is formed by a plurality of drawn carbon nanotube films stacked and crossed with each other. There is a cross angle between the carbon nanotubes in the adjacent carbon nanotube drawn films, and the cross angle is greater 0 degrees and less than and equal to 90 degrees. Therefore, the carbon nanotubes in the plurality of drawn carbon nanotube films are interwoven to form a networked film structure.

The flocculated carbon nanotube film can include a number of carbon nanotubes entangled with each other. The carbon nanotubes can be substantially uniformly distributed in the flocculated carbon nanotube film. The flocculated carbon nanotube film can be formed by flocculating the carbon nanotube array. Examples of the flocculated carbon nanotube film are taught by U.S. Pat. No. 8,808,589 to Wang et al.

The pressed carbon nanotube film can include a number of disordered carbon nanotubes arranged along a same direction or along different directions. Adjacent carbon nanotubes are attracted to each other and combined by van der Waals force. A planar pressure head can be used to press the carbon nanotubes array along a direction perpendicular to the substrate, a pressed carbon nanotube film having a plurality of isotropically arranged carbon nanotubes can be obtained. A roller-shaped pressure head can be used to press the carbon nanotubes array along a fixed direction, a pressed carbon nanotube film having a plurality of carbon nanotubes aligned along the fixed direction is obtained. The roller-shaped pressure head can also be used to press the array of carbon nanotubes along different directions, a pressed carbon nanotube film having a plurality of carbon nanotubes aligned along different directions is obtained. Examples of the pressed carbon nanotube film are taught by U.S. Pat. No. 7,641,885 to Liu et al.

The carbon nanotube paper comprises a plurality of carbon nanotubes arranged substantially along a same direction, and the plurality of carbon nanotubes are joined end to end by van der Waals force in an extending direction, and the plurality of carbon nanotubes are substantially parallel to a surface of the carbon nanotube paper. Examples of the carbon nanotube paper are taught by U.S. Pat. No. 9,017,503 to Zhang et al.

The carbon nanotube structure is substantially pure, and thus a specific surface area of the plurality of carbon nanotube of the carbon nanotube structure is large. Therefore, the carbon nanotube structure has a great stickiness. In one embodiment, the carbon nanotube structure is fixed on the surface of the insulating substrate 104 by its own great stickiness. In one embodiment, the carbon nanotube structure is fixed on the surface of the insulating substrate 104 by an adhesive.

The higher an energy of an electron beam, the greater a penetration depth in the porous carbon material layer 102, on the contrary, the smaller the penetration depth. In one embodiment, the energy of the electron beams is less than or equal to 20 keV, and a thickness of the porous carbon material layer 102 is in a range from about 200 micrometers to about 600 micrometers. When the thickness of the porous carbon material layer 102 is in the range of 200 micrometers to 600 micrometers, the electron beam does not easily penetrate the porous carbon material layer 102 and be reflected from the porous carbon material layer 102; and the porous carbon material layer 102 has a high electron absorption rate. In one embodiment, the thickness of the porous carbon material layer 102 is in a range from 300 micrometers to about 500 micrometers. In another embodiment, the thickness of the porous carbon material layer 102 is in a range from 250 micrometers to about 400 micrometers.

In one embodiment, the porous carbon material layer 102 is the super-aligned carbon nanotube array, and a height of the super-aligned carbon nanotube array is in a range from about 350 micrometers to about 600 micrometers. When the thickness of the super-aligned carbon nanotube array is in the range of 350 micrometers to 600 micrometers, the electron beam does not easily penetrate the super-aligned carbon nanotube array and be reflected from the super-aligned carbon nanotube array; and the super-aligned carbon nanotube array has a high electron absorption rate. In one embodiment, the thickness of the super-aligned carbon nanotube array is in a range from 400 micrometers to about 550 micrometers. In another embodiment, the thickness of the super-aligned carbon nanotube array is 550 micrometers.

When the secondary electron probe 10 is in use, after the electron beam hits the surface of the sample, the secondary electrons are emitted from the sample and collected by the porous carbon material layer 102, thereby the secondary electrons are detected by the secondary electron probe 10.

The secondary electron probe 10 has advantages as follows: the secondary electron probe 10 only consists of the porous carbon material layer 102, therefore, the structure of the secondary electron probe 10 is simple. The porous carbon material layer 102 can be regarded as an absolute black body of secondary electrons; the porous carbon material layer has an excellent secondary electron collection effect. Therefore, when the secondary electron probe 10 is used to detect the secondary electrons emitting from the sample, substantially no secondary electrons is missed; an absorption rate of the secondary electrons of the secondary electron probe 10 is more than 99.99%, and a detection accuracy of secondary electrons of the secondary electron probe 10 is high. Further, the porous carbon material layer 102 can be a carbon nanotube structure, the carbon nanotube structure has good electrical conductivity, flexibility and strength, and thus the carbon nanotube structure can be used in extreme environments such as high temperature and low temperature; the secondary electron probe 10 has a wide range of applications. A weight of the carbon nanotube structure is light, which is conducive to actual operation. The secondary electron probe 10 can be suitable for microdevices with strict requirements on quality and volume.

Figure 4:
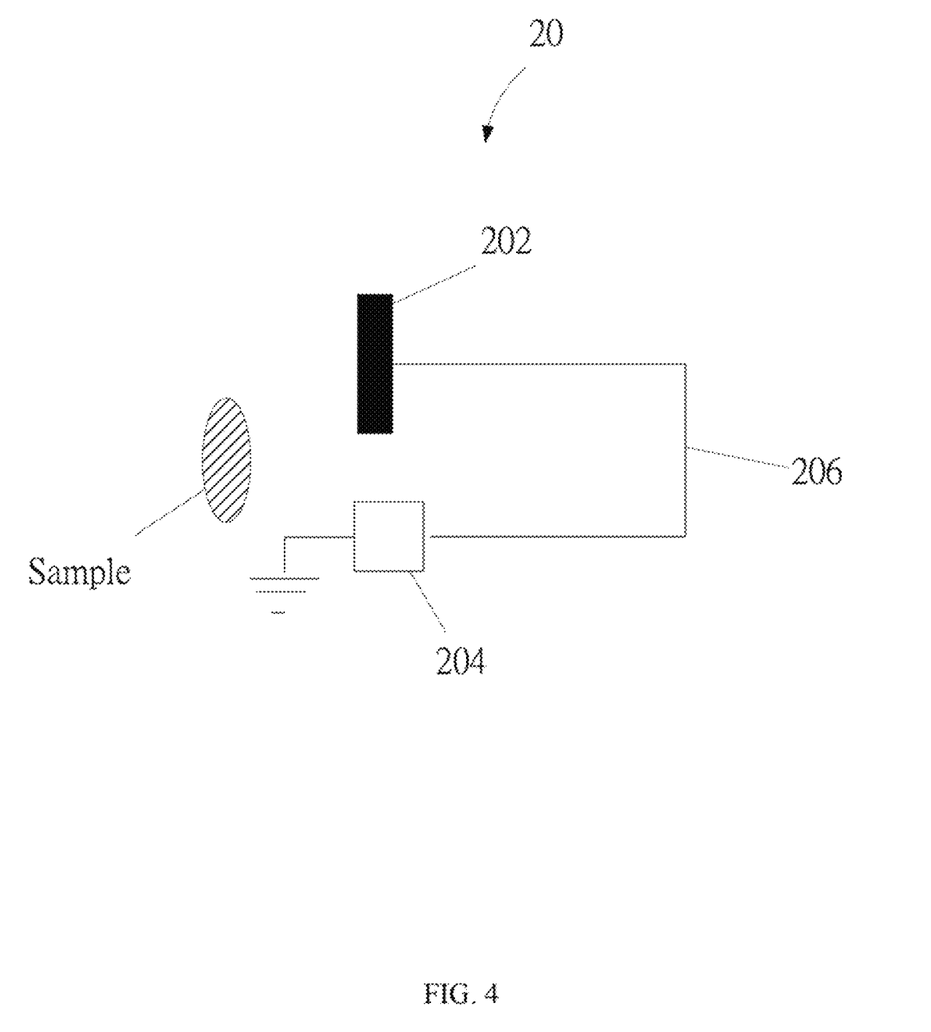
FIG. 4 is a structure schematic diagram of one embodiment of a secondary electron detector.

Referring to FIG. 4, one embodiment is described in relation to a secondary electron detector 20. The secondary electron detector 20 comprises a secondary electron probe 202 and a test unit 204. The test unit 204 comprises a first terminal and a second terminal. The first terminal is electrically connected to the secondary electron probe 202 through a wire 206, and the second terminal is grounded.

The secondary electron probe 202 is the same as the secondary electron probe 10, and the secondary electron probe 202 comprises all technical features of the secondary electron probe 10.

The test unit 204 is used to test the secondary electrons collected by the secondary electron probe 202 and perform a numerical conversion. The test unit 204 can be but not limited to an ammeter, a voltmeter, or a temperature display. In one embodiment, the test unit 204 is the ammeter, the secondary electrons collected by the secondary electron probe 202 are transmitted to the ammeter through the wire 206, a current value generated by the secondary electrons can be read by the ammeter, and then the number of the secondary electrons emitting from the surface of the sample can be obtained.

In one embodiment, the test unit 204 comprises an output unit (no shown), and a signal measured by the test unit 204 is output through the output unit. The output unit can be an image display, alarm, or the like. In one embodiment, the output unit is a Liquid Crystal Display (LCD), and the LCD display forms an image output according to a signal measured by the test unit 204.

When the secondary electron detector 20 is in use, first the electron beam hits a surface of the sample; and the secondary electrons are emitted from the sample and collected by the porous carbon material layer 202. The secondary electrons collected by the secondary electron probe 202 are transmitted to the test unit 204 through wires 206. Then the number of the secondary electrons emitting from the surface of the sample can be obtained through the signal tested by the test unit 204, the signal tested by the test unit 204 can be a current, a voltage or a temperature generated by the secondary electrons collected by the secondary electron probe 202. And finally the signal tested by the test unit 204 is output through the output unit, such as forming an image.

Figure 5:
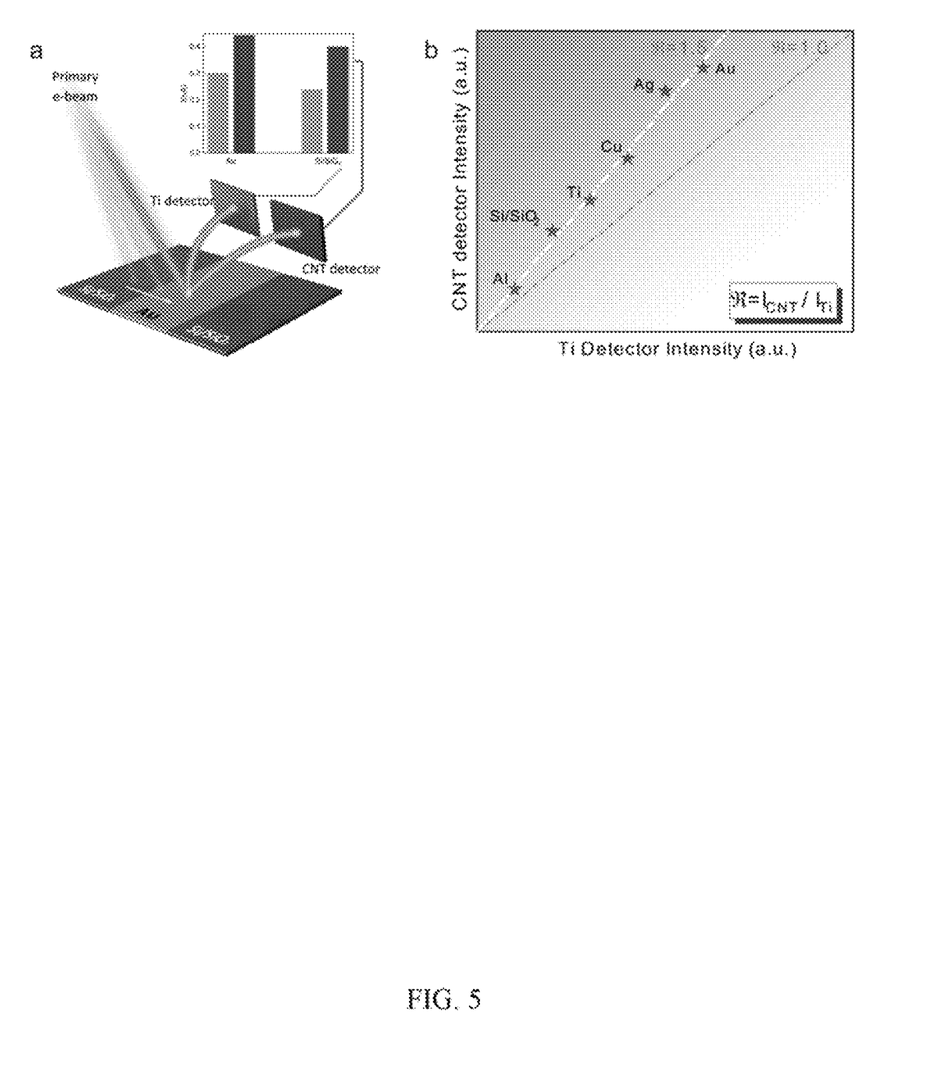
FIG. 5 is a structure schematic diagram and a current intensity comparison diagram of each of the secondary electron detector of FIG. 4 and the conventional secondary electron detector used to test samples.

Referring to FIG. 5, the secondary electron detector 20 with the super-aligned carbon nanotube array as the secondary electron probe and a conventional secondary electron detector with titanium (Ti) metal as the secondary electron probe are respectively used to test Al, Si/SiO$_2$, Ti, Cu, Ag, Au. A difference between the two secondary electron detectors is only the secondary electron probe. It can be seen from the illustration in FIG. 5a, under a same condition, when testing Au samples, the collection efficiency of the secondary electron detector 20 for secondary electrons increased by 46.21%; when testing Si/SiO$_2$ samples (where a thickness of SiO$_2$ is 300 nm), the collection efficiency of the secondary electron detector 20 for secondary electrons is increased by 67.5%. A slope of the line in FIG. 5b represents a ratio of a current intensity collected by the secondary electron detector 20 and a current intensity collected by the conventional secondary electron detector to detect the same sample. It can be seen from FIG. 5b, when testing each of the Al, Ti, Cu, Ag, and Au samples, the collection efficiency of the secondary electron detector 20 is increased by about 50% compared with the conventional secondary electron detector. Therefore, compared with the conventional secondary electron detector with Ti metal as the secondary electron probe, the secondary electron detector 20 of the present invention collects more secondary electrons from the surface of the sample, and the secondary electron detector 20 has a higher accuracy in detecting secondary electrons.

The secondary electron detector 20 has advantages as follows: the secondary electron probe 202 of the secondary electron detector 20 consists of the porous carbon material layer. The porous carbon material layer can be regarded as an absolute black body of secondary electrons, when the secondary electron detector 20 is used to detect the secondary electrons emitting from the surface of sample, substantially no secondary electrons is missed. Therefore, a collection efficiency and a detection accuracy for secondary electron are both high. The secondary electron probe 202 of the secondary electron detector 20 only consists of the porous carbon material layer 102, and thus the structure of the secondary electron probe 10 is simple. Further, the porous carbon material layer 102 can be a carbon nanotube structure, the carbon nanotube structure has excellent electrical conductivity, flexibility and strength, and thus the carbon nanotube structure can be used in extreme environments such as high temperature and low temperature; and the secondary electron detector 20 has a wide range of applications. Since a weight of the carbon nanotube structure is light, which is conducive to actual operation, the secondary electron detector 20 can be suitable for microdevices with strict requirements on quality and volume.

Figure 6:
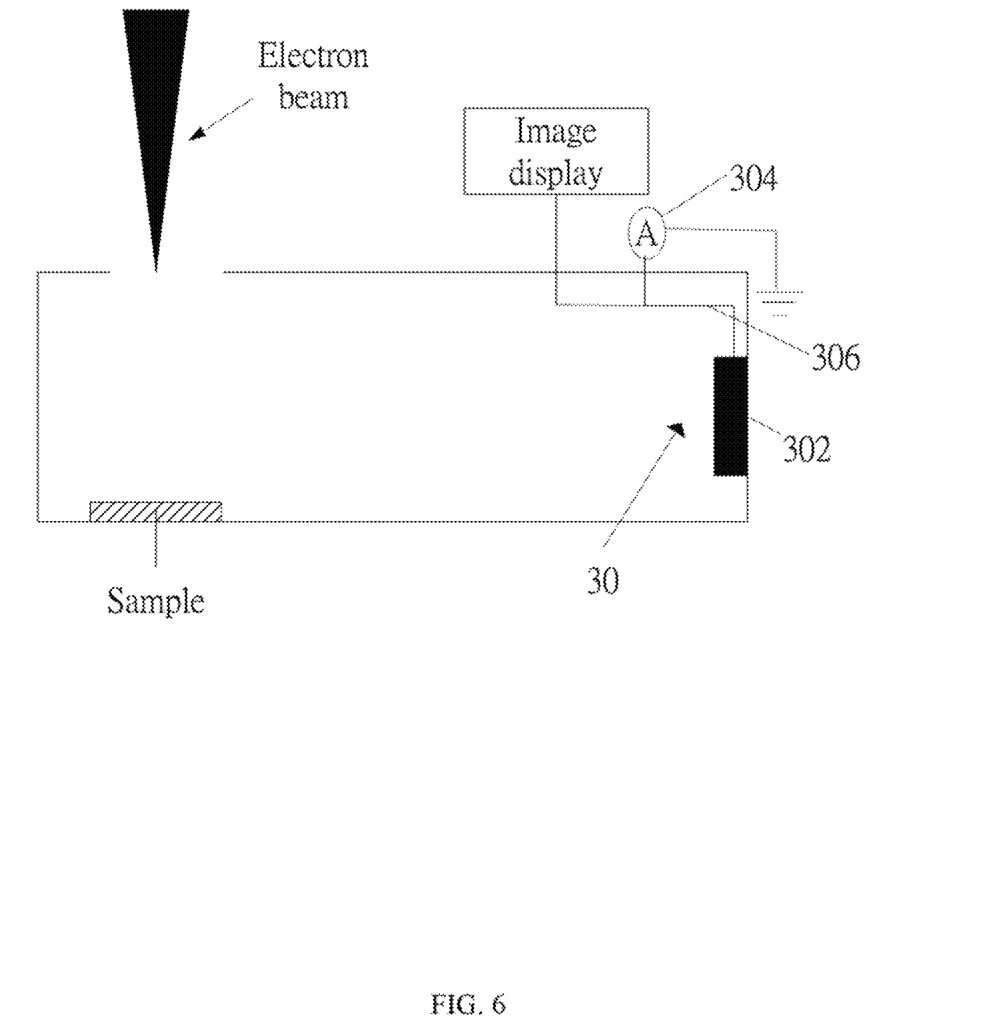
FIG. 6 is a structure schematic diagram of one embodiment of a scanning electron microscope detector.

Referring to FIG. 6, one embodiment is described in relation to a scanning electron microscope detector 30. The scanning electron microscope detector 30 comprises a secondary electron probe 302 and an ammeter 304. The ammeter 304 comprises a first terminal and a second terminal. The first terminal is electrically connected to the secondary electron probe 302 through a wire, and the second terminal is grounded. An image display of a scanning electron microscope is electrically connected to the secondary electron probe 302 and the ammeter 304, and the image display images according to a current value in the ammeter 304.

The secondary electron probe 302 is the same as the secondary electron probe 10, and the secondary electron probe 302 comprises all technical features of the secondary electron probe 10. The secondary electron probe 302 comprises the porous carbon material layer 102.

The secondary electron probe 302 can be located in a chamber of the scanning electron microscope and spaced apart from the sample. In one embodiment, the secondary electron probe 302 is fixed on a side wall of the chamber of the scanning electron microscope. Since the sample is generally placed at a bottom of the chamber of the scanning electron microscope, when the secondary electron probe 302 is fixed on a side wall of the chamber of the scanning electron microscope, the secondary electron probe 302 is located obliquely above the sample, which is more conducive to collecting secondary electrons emitting from the surface of the sample. Compared with conventional scanning electron microscope detectors, the secondary electron probe 302 is closer to the sample, thereby making the collection rate of secondary electrons higher. In one embodiment, the secondary electron probe 302 is located in the cavity of the scanning microscope through a fixed bracket.

In one embodiment, the porous carbon material layer 102 of the secondary electron probe 302 is the carbon nanotube array. There is a crossing angle between an extending direction of the carbon nanotubes of the carbon nanotube array and the side wall of the chamber. The crossing angle is greater than 0 degrees and less than or equal to 90 degrees. The crossing angle is more conducive to the micro gaps in the carbon nanotube array to prevent the secondary electrons emitted from the carbon nanotube array, to improve the absorption rate of the carbon nanotube array for the secondary electrons; and thereby improving the detection accuracy of the secondary electrons. In one embodiment, the porous carbon material layer 102 is the super-arranged carbon nanotube array, and an extending direction of the carbon nanotubes of the super-arranged carbon nanotube array is perpendicular to the side wall of the chamber of the scanning microscope.

When the scanning electron microscope detector 30 is in use, a high-energy electron beam emitted from an electron emitting end of the scanning electron microscope hits the sample, the secondary electrons are emitted from the surface of the sample and collected by the porous carbon material layer 302; a current value generated by the secondary electrons collected by the secondary electron probe 302 is obtained by the ammeter 304; and the image display device of the scanning electron microscope images according to the current value, and then the photo of the surface topography of the sample is obtained.

Figure 7:
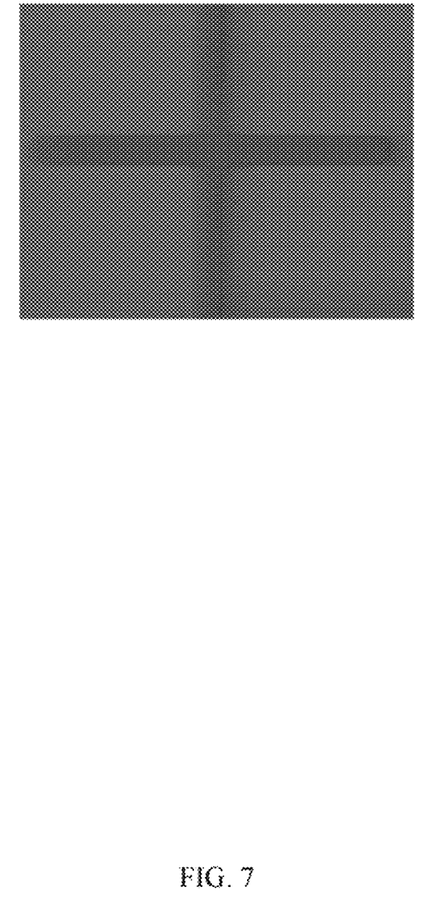
FIG. 7 is an image of a sample obtained by the scanning electron microscope using the super-arranged carbon nanotube array as the secondary electron probe.
Figure 8:
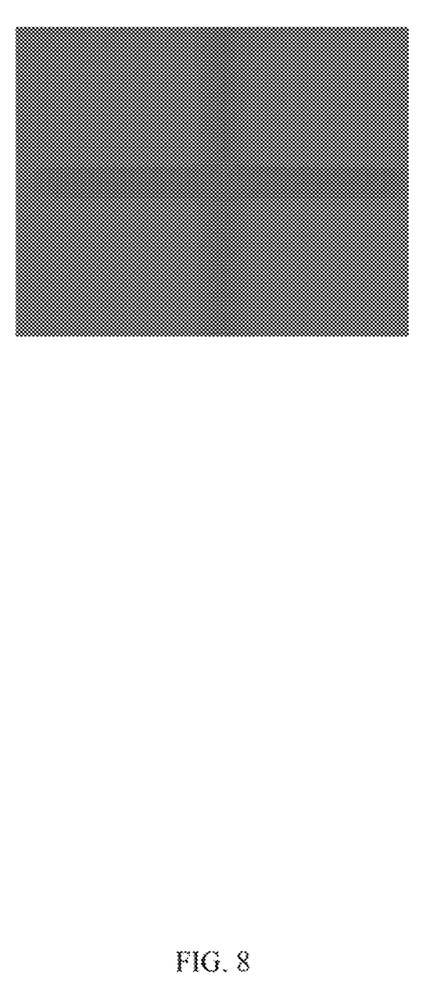
FIG. 8 is an image of a sample obtained by the scanning electron microscope using titanium metal as a secondary electron probe.

FIG. 7 is an image of a sample obtained by the scanning electron microscope using the super-arranged carbon nanotube array as the secondary electron probe of the present invention. FIG. 8 is an image of a sample obtained by the scanning electron microscope using titanium metal as a secondary electron probe. The sample in FIG. 7 and the sample in FIG. 8 are the same, and they are both formed by a gold electrode placed on a Si/SiO$_2$ substrate. The difference between the scanning electron microscope in FIG. 7 and the scanning electron microscope in FIG. 8 is only the secondary electron probe, and the other components are the same. Comparing FIG. 7 and FIG. 8 can be seen that the image collected by the scanning electron microscope using the scanning electron microscope detector 30 is darker than the image collected by the conventional scanning electron microscope using Ti metal as the secondary electron probe. Therefore, compared with Ti metal as the secondary electron probe, the current collected by the scanning electron microscope detector 30 is greater, and more secondary electrons are collected by the scanning electron microscope detector 30.

The scanning electron microscope detector 30 has advantages as follows: the secondary electron probe 302 of the scanning electron microscope detector 30 consists of the porous carbon material layer. There are nanoscale or microscale gaps between a plurality of carbon material particles in the porous carbon material layer. When the secondary electrons enter the porous carbon material layer, the secondary electrons are refracted and reflected multiple times in the gaps between the plurality of carbon material particles, and the secondary electrons cannot be emitted from the porous carbon material layer, and an electron absorption rate of the porous carbon material layer can reach almost 100%. Therefore, the porous carbon material layer can be regarded as an absolute black body of secondary electrons. The scanning electron microscope detector 30 has an excellent collection effect on secondary electrons, and when the scanning electron microscope detector 30 is used to detect the secondary electrons, there is substantially no secondary electrons is missed. And thus, the surface topography of the sample obtained by the scanning electron microscope using the scanning electron microscope detector 30 is clear, and the degree of truth is high. Since the absorption rate of the porous carbon material layer for secondary electrons is above 99.99%, it can almost reach 100%, the current signal obtained by the ammeter is great. The secondary electron probe of the scanning electron microscope detector 30 collects the secondary electrons and directly measures the current value through the ammeter; and the image display of the scanning electron microscope images according to the current signal, and the surface topography of the sample is obtained. Therefore, there is no need to perform electrical-optical-electrical conversion like the conventional scanning electron microscopes, the scanning electron microscope detector 30 of the present invention can simplify the structure and reduce the cost of the scanning electron microscope.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:
1. A secondary electron probe, comprising:
a porous carbon material layer, wherein the porous carbon material layer consists of a plurality of carbon material particles and a plurality of micro gaps, the plurality of micro gaps are defined by the plurality of carbon material particles, and the porous carbon material layer is an electronic blackbody, the plurality of carbon material particles are spherical particles.
2. The secondary electron probe of claim 1, wherein the porous carbon material layer consists of a plurality of pure carbon material particles, and the plurality of pure carbon material particles consist of carbon atoms.

3. The secondary electron probe of claim 1, wherein a diameter of each of the spherical particles is less than or equal to 1000 micrometers.

4. The secondary electron probe of claim 1, wherein a thickness of the porous carbon material layer is in a range from 200 micrometers to 600 micrometers.

5. The secondary electron probe of claim 1, further comprising a substrate, wherein the porous carbon material layer is located on the substrate.

6. A secondary electron detector comprising:
   a secondary electron probe comprising a porous carbon material layer, wherein the porous carbon material layer consists of a plurality of carbon material particles and a plurality of micro gaps, the plurality of micro gaps are located between the plurality of carbon material particles, and the porous carbon material layer is an electronic blackbody; and
   a test unit comprising a first terminal and a second terminal, wherein the first terminal is electrically coupled with the secondary electron probe, and the second terminal is grounded.

7. The secondary electron detector of claim 6, wherein the plurality of carbon material particles are carbon fibers, carbon micron-wires, carbon nanotubes, carbon nanospheres or carbon microspheres.

8. The secondary electron detector of claim 6, wherein the porous carbon material layer is a carbon nanotube array or a carbon nanotube network structure.

9. The secondary electron detector of claim 8, wherein the carbon nanotube network structure is a carbon nanotube sponge, a carbon nanotube film structure, a carbon nanotube paper, or a network structure comprising a plurality of carbon nanotube wires woven or entangled with each other.

10. The secondary electron detector of claim 6, wherein the porous carbon material layer is a super-aligned carbon nanotube array, and a height of the super-aligned carbon nanotube array is in a range from 350 micrometers to 600 micrometers.

11. A scanning electron microscope detector comprising:
    a secondary electron probe comprising a porous carbon material layer, wherein the porous carbon material layer consists of a plurality of carbon material particles and a plurality of micro gaps, the plurality of micro gaps are located between the plurality of carbon material particles, and the porous carbon material layer is an electronic blackbody; and
    an ammeter comprising a first terminal and a second terminal, wherein the first terminal is electrically coupled with the secondary electron probe to obtain a current value data generated by secondary electrons, and the second terminal is grounded,
    wherein the secondary electron probe and the ammeter is electrically connected to an image display of a scanning electron microscope, and the image display images according to the current value obtained by the ammeter.

12. The scanning electron microscope detector of claim 11, wherein the plurality of carbon material particles are carbon fibers, carbon micron-wires, carbon nanotubes, carbon nanospheres or carbon microspheres.

13. The scanning electron microscope detector of claim 11, wherein the porous carbon material layer is a carbon nanotube array or a carbon nanotube network structure.

14. The scanning electron microscope detector of claim 11, wherein the carbon nanotube network structure is a carbon nanotube sponge, a carbon nanotube film structure, a carbon nanotube paper, or a network structure comprising a plurality of carbon nanotube wires woven or entangled with each other.

15. The scanning electron microscope detector of claim 11, wherein the porous carbon material layer is a super-aligned carbon nanotube array, and a height of the super-aligned carbon nanotube array is in a range from 350 micrometers to 600 micrometers.

* * * * *